US 8,210,164 B2

(12) United States Patent
Herniak

(10) Patent No.: US 8,210,164 B2
(45) Date of Patent: Jul. 3, 2012

(54) QUASI-PARABOLIC SOLAR CONCENTRATOR AND METHOD

(76) Inventor: Edward Herniak, Amherst (CA)

(*) Notice: Subject to any disclaimer, the term of this patent is extended or adjusted under 35 U.S.C. 154(b) by 0 days.

(21) Appl. No.: 13/242,731

(22) Filed: Sep. 23, 2011

(65) Prior Publication Data

US 2012/0014006 A1   Jan. 19, 2012

(51) Int. Cl.
*F24J 2/12* (2006.01)
*G02B 5/10* (2006.01)
*H02N 6/00* (2006.01)
*H01L 31/042* (2006.01)

(52) U.S. Cl. .................... 126/690; 359/853; 136/246
(58) Field of Classification Search ............... 359/853; 126/690, 694; 136/246
See application file for complete search history.

(56) References Cited

U.S. PATENT DOCUMENTS

| | | | |
|---|---|---|---|
| 4,146,408 A | 3/1979 | Nelson | |
| 4,317,031 A | 2/1982 | Findell | |
| 4,337,758 A | 7/1982 | Meinel et al. | |
| 4,359,265 A | 11/1982 | Winston | |
| 5,465,708 A * | 11/1995 | Goebel et al. ............ | 126/635 |
| 6,541,694 B2 | 4/2003 | Winston et al. | |
| 6,620,995 B2 | 9/2003 | Vasylyev et al. | |
| 7,763,840 B2 | 7/2010 | Anderson | |
| 7,797,939 B2 | 9/2010 | Green | |
| 7,834,303 B2 | 11/2010 | Fatehi et al. | |
| 2008/0230049 A1 | 9/2008 | Dol | |
| 2010/0212742 A1 | 8/2010 | Engel et al. | |
| 2010/0243136 A1 | 9/2010 | Hoermann et al. | |

FOREIGN PATENT DOCUMENTS

WO   2010067209 A2   6/2010

OTHER PUBLICATIONS

Online Abstract at "http://spie.org/x41745.xml?ArticleID=x41745", pp. 1 to 5 [as printed] in respect of [Pablo Zamora, Pablo Benitez, Juan Carlos Minano et al., "A high-performance photovoltaic concentrator", Solar & Alternative Energy, Sep. 21, 2010, SPIE Newsroom].
Online Abstract at "http://spie.org/x648.html?product_id=448826", pp. 1 to 3 [as printed] in respect of [David G. Jenkins, "High-uniformity solar concentrators for photovoltaic systems" (Proceedings Paper), Roland Winston, Ed.,Nonimaging Optics: Maximum Effeciency Light Transfer VI, Nov. 19, 2001 pp. 52-59, Proceedings vol. 4446, SPIE Newsroom].

(Continued)

*Primary Examiner* — Alessandro Amari
(74) *Attorney, Agent, or Firm* — Freedman & Associates

(57) ABSTRACT

A quasi-parabolic reflector and method are provided for a solar concentrator which produces a unique radiation pattern which is less susceptible to surface defects, less sensitive to target distance irregularities, and having greater uniformity of intensity for PV applications in comparison to that produced by true parabolic reflectors. Cross-sections of the quasi-parabolic reflector include spaced reflective surfaces which have focal areas spaced one from the other about an axis of symmetry. A method for forming petals of a quasi-parabolic reflector includes stamping them into shape using a stamping apparatus with a higher radius of curvature than the finished petal and iteratively testing and stamping the petal until the petal passes or fails a quality and accuracy threshold.

7 Claims, 11 Drawing Sheets

OTHER PUBLICATIONS

Gary Jorgensen and Tim Wendelin, "Uniform Flux Dish Concentrators for Photovoltaic Application", May 1992, National Renewable Energy Laboratory (formerly the Solar Energy Research Institute), pp. 1 to 5, Golden Colorado, USA, Document ID: NREL/TP-441-4800 • UC Category: 234 • DE92010566.
Online Abstract at "http://www.sciencedirect.com/science_ob=ArticleURL&_udi=B6V51-4MKV2M0-2&_user=10&_c...", pages 1 to 4 [as printed] in respect of [Johan Nilsson, Ralf Leutz and Björn Karlsson, "Micro-structured reflector surfaces for a stationary asymmetric parabolic solar concentrator", Solar Energy Materials and Solar Cells, Mar. 23, 2007, pp. 525-533, vol. 91, Issue 6, Elsevier B.V., Germany].

* cited by examiner

QUASI-PARABOLIC SOLAR CONCENTRATOR AND METHOD

FIELD OF THE INVENTION

The invention relates to solar concentrators, and more particularly to the shape and manufacture of solar reflectors for concentrating sunlight onto photovoltaic or thermal absorption devices.

BACKGROUND OF THE INVENTION

Solar concentrators are used to collect energy emitted by the sun in the form of radiation. Known solar concentrators are shaped so as to direct sunlight incident on a large area spanned by the solar concentrator into a much smaller target area occupied by a device which converts the sun's radiation in the form of light and/or heat into usable energy. Generally the configurations of solar concentrators include a combination of reflectors, lenses, and radiation diffusers. Typical known solar concentrators often utilize a large single or compound reflector for concentrating sunlight incident upon a relatively large area into a smaller target area at which location further reflectors, lenses and/or diffusers are used to further focus and/or diffuse the incident radiation prior to its falling incident upon the target device for conversion into usable energy.

One known base shape that is often used for solar concentrators is the parabola. A two-dimensional parabola has the property that, at any point on the parabola, the angle between a line passing through the point parallel with the axis of symmetry of the parabola, and the normal of the curve at that point on the parabola, is the same as the angle between the normal and a line passing through the point and what is known as the focus of the parabola. Consequently, parallel rays from infinity are focused into a single point or a relatively small area located at the focus.

Two widely used types of parabolic reflectors, having a three-dimensional form based on the parabola, are the parabolic trough and the parabaloid or parabolic dish reflector.

A parabolic trough is a trough shaped reflector which has, in any plane perpendicular to its length, a two-dimensional profile in the shape of a parabola, and hence has a three-dimensional shape of that parabola extruded along the length of the trough. This kind of reflector has a focal line running the length of the trough and passing through the foci of the parabolas in the planes perpendicular to its length.

A parabolic dish reflector is a parabaloid shaped reflector which has, in any plane parallel with and intersecting the reflector's axis of rotational symmetry, a two-dimensional profile in the shape of a parabola, and hence has a three-dimensional shape of that parabola rotated about its axis of symmetry. This kind of reflector has a focal point located along the axis of symmetry and at the foci of all the rotationally symmetric parabolas in the planes parallel with and intersecting the axis.

FIG. 1 is a two-dimensional cross-sectional view of a known parabolic concentrator 100 which view is illustrative of both a parabolic trough and a parabolic dish reflector. For simplicity the parabola of the two-dimensional profile of the parabolic reflector of the parabolic concentrator 100 is simply referred to as the parabola 110. Incoming radiation 105i from infinity or the sun which is parallel to the axis of symmetry 102 of the parabola 110 is reflected by the parabola 110 as reflected radiation 105r, which converges at focus 103.

Known systems which collect solar radiation and convert it into thermal energy, typically use a reservoir or conduit such as a pipe containing a liquid which is heated up by the radiation focused by the parabola 110, the thermal energy of which is used ultimately for the generation of electrical energy. FIG. 1 depicts a cross-section of a pipe 122 which is for conducting fluid to be heated near the focus 103 of the parabola 110. The pipe 122 is located at a distance 101b from the parabola 110 which is substantially at the focus 103 of the parabola 110 such that most or all of the reflected radiation 105r of the parabola 110 is incident upon the surface of the pipe 122. The materials used for the pipe 122, or other reservoir or conduit, at least in the region substantially at the focus 103 of the parabola 110, are such that they are capable of withstanding the intensity of the reflected radiation 105r focused by the parabolic reflector 100 and are ideal for converting the reflected radiation 105r into thermal energy and transferring that energy in the form of heat to the fluid passing therethrough.

Known systems which collect solar energy by converting light directly into electricity typically utilize photovoltaic (PV) cells arranged in a PV panel or unit to collect the light focused by the parabola 110 and convert it into electrical current. Typically, PV units are of finite dimensions, having a finite area spanned by a number of PV cells, and have maximal efficiency when the radiation incident upon the photovoltaic cells of the PV unit have the same intensity i.e. when the incident radiation upon the active area of the PV unit is homogeneous. In general a PV unit's efficiency is limited by the lowest intensities incident upon its radiation collecting surface, and consequently, localized shadows or minima in the incident radiation are a concern whereas localized bright areas or maxima are generally not. Additionally, there are limits to the intensity of the radiation to which any portion of a PV unit may be subjected without it malfunctioning or undergoing permanent irreparable damage. Hence, a PV unit is typically positioned either between the focus 103 and the parabola 110 such as a PV unit 120a at a distance 101a from the parabola 110, or at a distance beyond the focus 103 from the parabola 110, such as a PV unit 120b at a distance 101c from the parabola 110. Due to the finite area of the PV unit, not all of the incident radiation 105i near the axis of symmetry 102 will be incident upon the parabola 110. Specifically, a shadow is cast by the PV unit 120a, 120b which is reflected as a shadow 108 within the reflected radiation 105r.

In some known systems utilizing PV units, a radiation diffuser in the form of a substantially transparent plate or lens (not shown for clarity) is positioned so as to intercept and diffuse the radiation reflected by the parabola 110 prior to its falling incident upon the photovoltaic cells of the PV unit 120a, 120b. Although this technique improves homogeneity of the intensity of the radiation incident upon the PV unit 120a, 120b, efficiency is sacrificed due to the energy lost in the form of the radiation reflected or refracted away from the PV unit 120a, 120b by the plate or lens and/or the radiation absorbed by the plate or lens and converted into heat at the plate or lens which is lost to the surrounding environment. As is discussed hereinbelow, the smaller the proportion of the reflected radiation which is diffused with use of a diffuser, the higher the efficiency of the parabolic concentrator 100.

The foregoing applies equally to known parabolic concentrators of both the parabolic trough and parabolic dish types, the difference between them being only that the parabolic dish is rotationally symmetric about a single axis and the parabolic trough is bilaterally symmetric in a plane passing through the axes of the parabolas of the trough.

SUMMARY OF THE INVENTION

According to one aspect, an embodiment of the invention provides for a quasi-parabolic reflector for a solar concentrator comprising: a concave reflective surface, the concave reflective surface comprising a cross-section substantially symmetric about an axis of symmetry, wherein the cross-section comprises: a first reflective portion on a first side of the axis of symmetry, the first reflective portion having a first focal area, the first focal area located on a concave side of the concave reflective surface and on the first side of the axis of symmetry and at a first distance away from the axis of symmetry; and a second reflective portion on a second side of the axis of symmetry, the second side of the axis of symmetry opposite the first side of the axis of symmetry, the second reflective portion having a second focal area, the second focal area located on the concave side of the concave reflective surface and on the second side of the axis of symmetry and at a second distance away from the axis of symmetry; and wherein the first focal area and the second focal area are substantially at a focal distance away from the concave side of the concave reflective surface, and wherein incident radiation which is incident upon the concave side of the concave reflective surface and propagating in a direction substantially parallel to the axis of symmetry is reflected from the concave reflective surface as reflected radiation such that reflected radiation reflected from the first reflective portion and reflected radiation reflected from the second reflective portion propagate to a radiation absorbing target.

According to another aspect, an embodiment of the invention provides for a method of processing petals for a solar concentrator comprising: performing an iterative procedure comprising: stamping the petal with a stamping apparatus comprising stamping surfaces having a greater curvature than a target curvature of a reference petal; determining at least one of a quality and an accuracy of the petal by taking multiple measurements with use of a laser beam reflected from the petal upon a target; and determining deviations of the multiple measurements from a reference set of measurements which would have been obtained with a reference petal; during each iteration of the iterative procedure, determining whether the deviations of the multiple measurements meet at least one of a quality and an accuracy criteria threshold, and if the deviations of the multiple measurements meet at least one of a quality and an accuracy criteria threshold, passing the petal as a finished petal and stopping the iterative procedure, and if the deviations of the multiple measurements do not meet at least one of a quality and an accuracy criteria threshold: determining if either the deviations of the multiple measurements exceed an absolute threshold or if the iterative procedure has been performed more times than a predetermined number, and performing one of: failing the petal and stopping the iterative procedure if either the deviations of the multiple measurements exceed an absolute threshold or if the iterative procedure has been performed more times than a predetermined number; and performing another iteration of the iterative procedure if the deviations of the multiple measurements do not exceed the absolute threshold and the iterative procedure has not been performed more times than the predetermined number.

BRIEF DESCRIPTION OF THE DRAWINGS

The features and advantages of the invention will become more apparent from the following detailed description of the preferred embodiment(s) with reference to the attached figures, wherein.

It is noted that in the attached figures, like features bear similar labels.

DETAILED DESCRIPTION OF THE PREFERRED EMBODIMENTS

Figure 2:
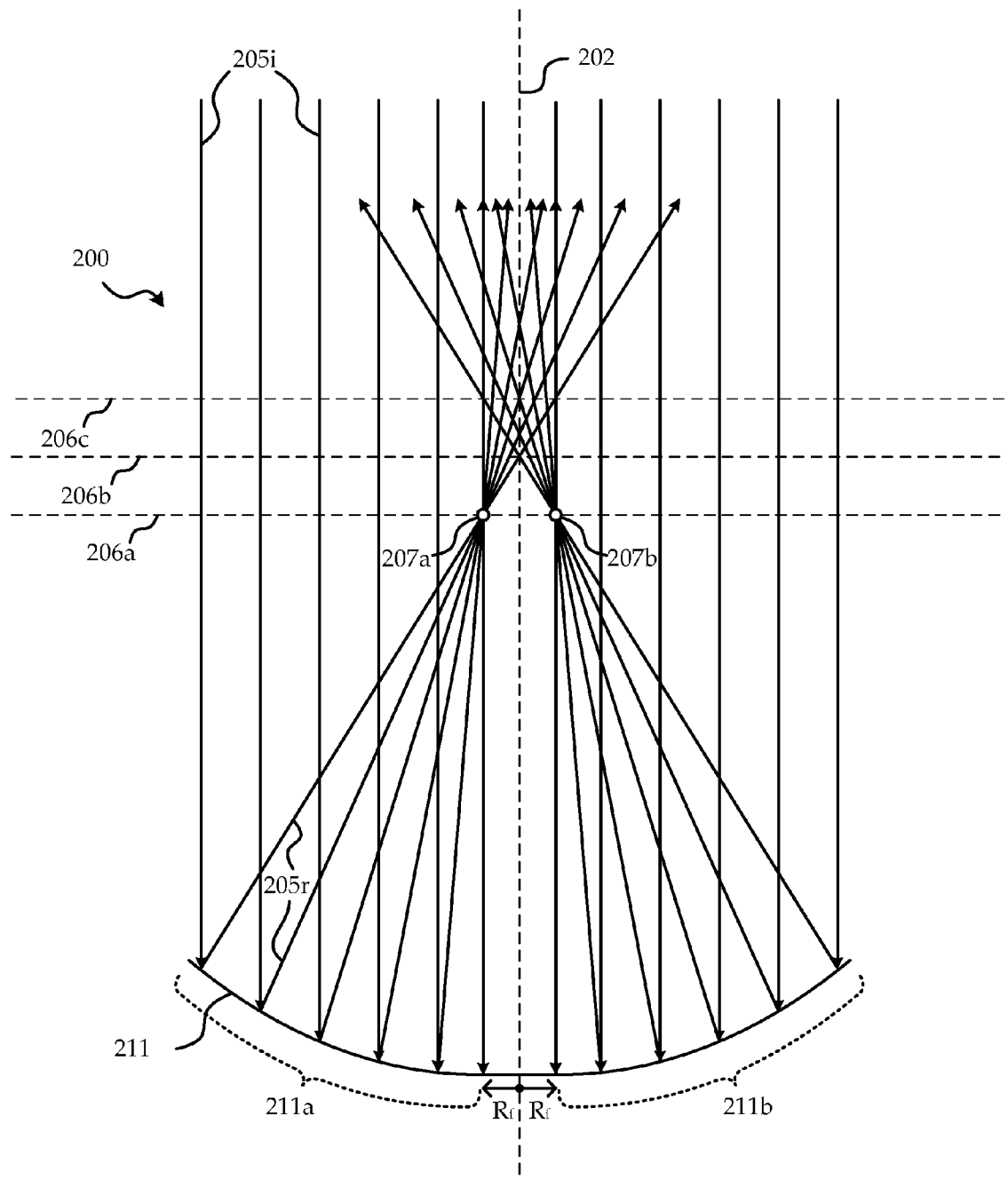
FIG. 2 is a diagram illustrating a quasi-parabolic reflector for quasi-parabolic concentrators according to an embodiment of the invention.

Referring to FIG. 2, a cross-section of a quasi-parabolic reflector 200 in accordance with a first embodiment of the invention will now be discussed in terms of its structure.

The shape of the cross-section of the quasi-parabolic reflector 200 is a quasi-parabola 211 which comprises two partial parabolas 211a and 211b each of which is shifted a distance $R_f$ away from the axis of symmetry 202 of the quasi-parabola 211.

Figure 1:
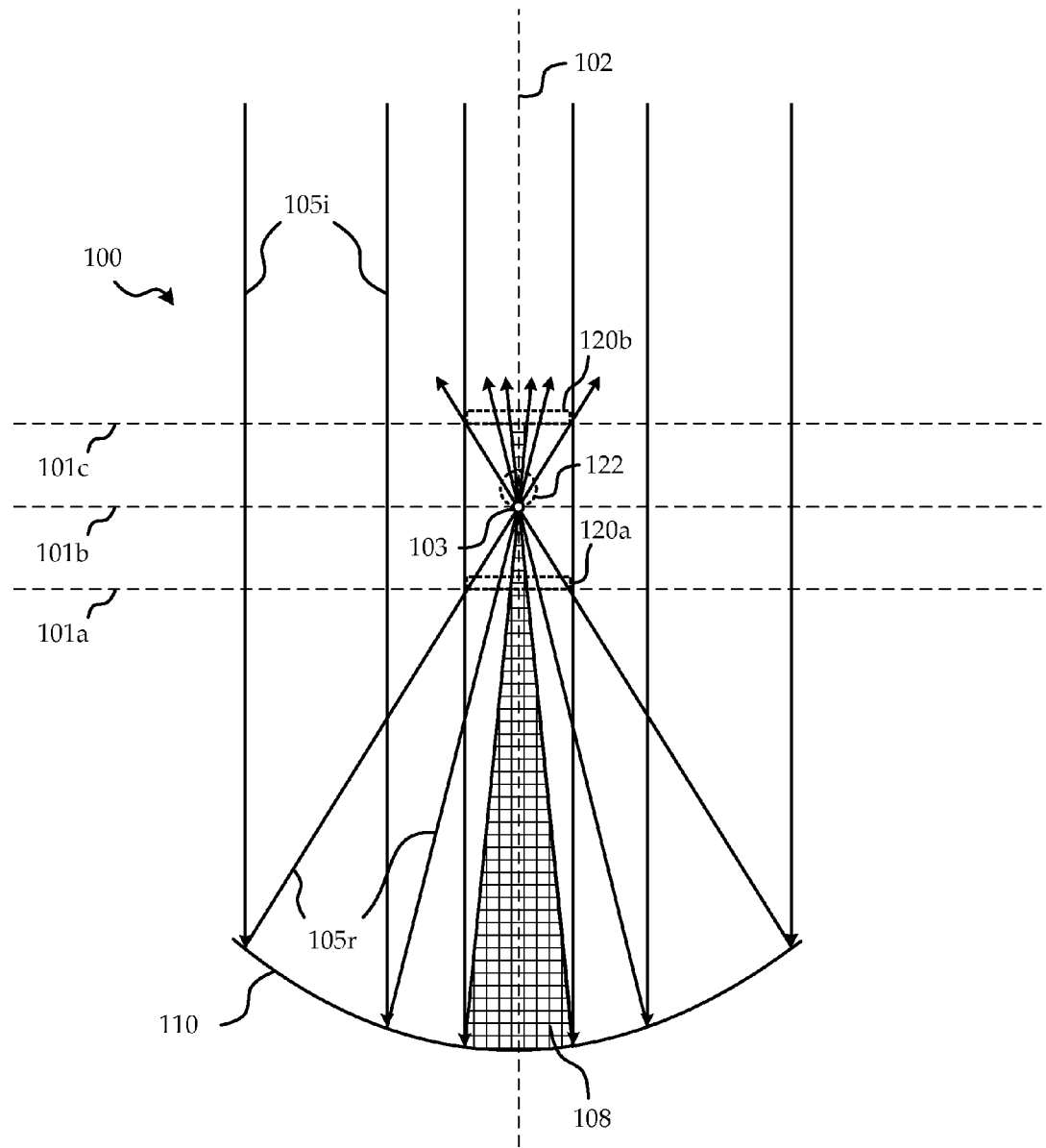
FIG. 1 is a diagram illustrating a known parabolic concentrator having a known parabolic reflector.

For simplicity of description, and for comparison with the known parabolic concentrator 100 depicted in FIG. 1, each partial parabola of the quasi-parabola 211, namely the left partial parabola 211a and the right partial parabola 211b have the same shape as respectively the left-half and the right-half of the parabola 110 of FIG. 1. Consequently, the left partial parabola 211a has a focal point 207a a distance $R_f$ to the left of the axis of symmetry 202, while the right partial parabola 211b has a focal point 207b a distance $R_f$ to the right of the axis of symmetry 202. The left partial parabola 211a and the right partial parabola 211b are either separated by a gap or void, or joined by a portion of the quasi-parabola 211 which need not serve to reflect any of the incident radiation 205i in any meaningful way.

The interaction between the incident radiation 205i and the quasi-parabola 211 provides reflected radiation 205r which differs significantly from reflected radiation 105r of the known parabola 110 of FIG. 1.

The foci 207a, 207b respectively of the left partial parabola 211a and the right partial parabola 211b are at a focal distance 206a away from quasi-parabola 211. As can be seen in FIG. 2, the reflected radiation 205r reflected from the outer portions of the left partial parabola and the right partial parabola crossover to become the inner portions of the reflected radiation 205r at a distance just greater than focal distance 206a. Reflected radiation 205r reflected from the inner portions of the left partial parabola and the right partial parabola crossover to become the outer portions of the reflected radiation 205r at a distance just greater than the focal distance 206a.

The overall nature of the radiation pattern reflected by the quasi-parabola 211 will now be described.

Between the quasi-parabola 211 and the foci 207a, 207b of the left and right partial parabolas, the radiation pattern comprises two converging sections on either side of the axis of symmetry 202 separated by a gap equal to twice the distance $R_f$. Between the focal distance 206a and an initial crossover distance 206b, the reflected radiation 205r from each focus 207a, 207b diverges such that the gap, which is twice the distance $R_f$ at the focal distance 206a, reduces to 0 at the initial crossover distance 206b, while the outer edge of the radiation pattern in this region maintains a generally constant radius $R_f$ from the axis of symmetry 202. At the initial crossover distance 206b from the quasi-parabola 211, reflected radiation 205r reflected from the outer portions of the left partial parabola and the right partial parabola just begin to intersect. At distances between the initial crossover distance 206b and a complete crossover distance 206c from the quasi-parabola 211, the portion of overlap between the reflected radiation 205r of the left partial parabola and the right partial parabola at the center of the radiation pattern increases from an infinitesimal amount at the initial crossover distance 206b to a complete overlap at the complete crossover distance 206c. At the complete crossover distance 206c, reflected radiation 205r reflected from the left partial parabola and the right partial parabola completely overlap with each other. At distances beyond the complete crossover distance 206c, the reflected radiation 205r reflected from the outer portions of the left partial parabola and the right partial parabola diverge such that they progressively overlap less and less with reflected radiation 205r from the other of the left partial parabola and the right partial parabola.

Figure 3:
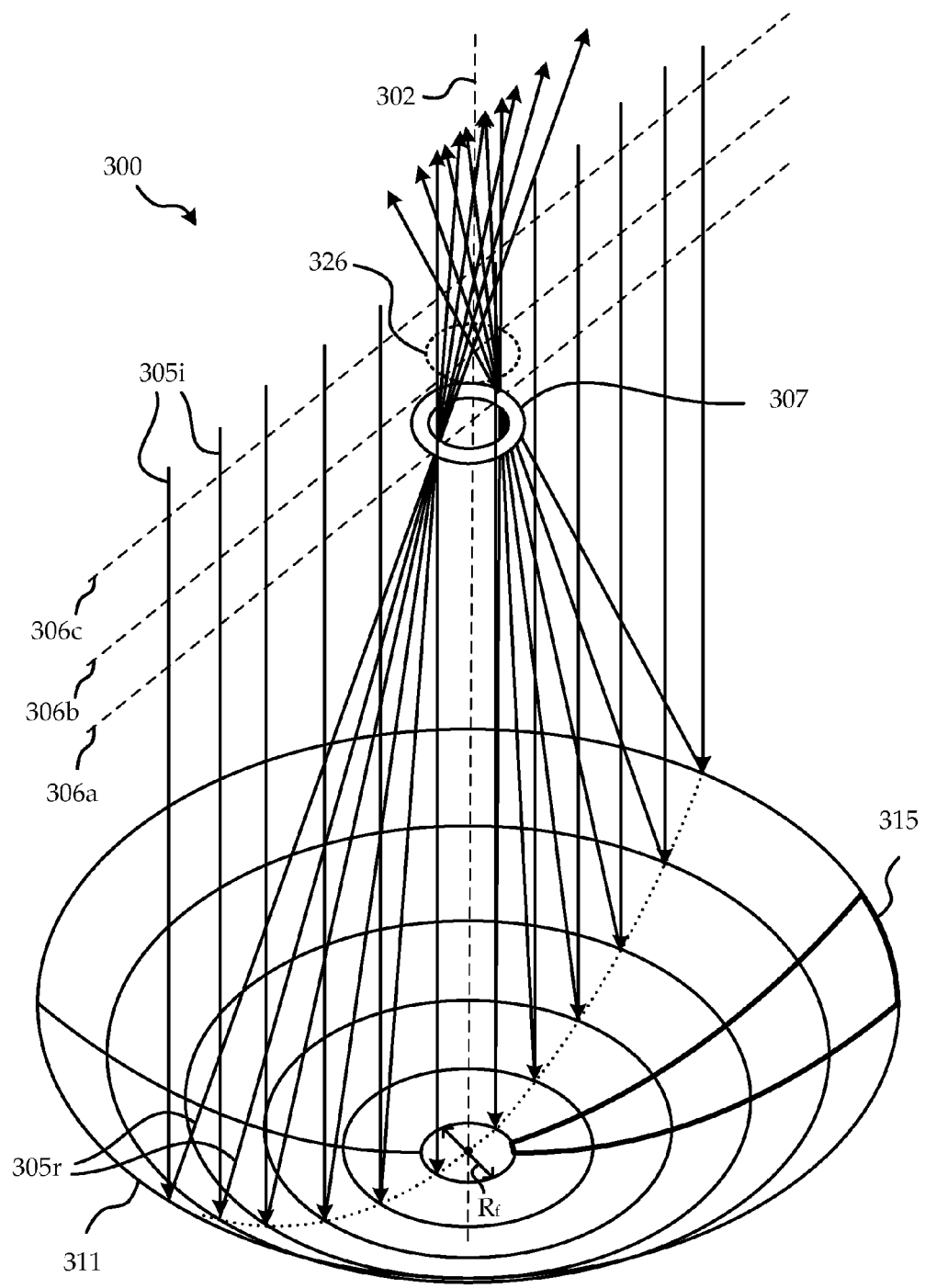
FIG. 3 is a diagram of a quasi-parabolic concentrator according to an embodiment of the invention.

Referring now to FIG. 3, a quasi-parabolic concentrator 300 in accordance with an embodiment of the invention will now be described. The quasi-parabolic concentrator 300 comprises a quasi-parabolic dish reflector 311 which is rotationally symmetric about the axis of symmetry 302, and has a two-dimensional profile in any plane parallel to and intersecting the axis of symmetry 302 similar to the quasi-parabola 211 depicted in FIG. 2. The quasi-parabolic dish reflector 311 is made up of petals 315 arranged in a rotationally symmetric and periodic pattern. The quasi-parabolic dish reflector 311 of FIG. 3 is made up of a total of 16 petals 315, only one of which is shown for clarity.

Incident radiation 305i from the sun is reflected by the quasi-parabolic dish reflector 311 as reflected radiation 305r. As can be seen in FIG. 3, the resulting radiation pattern formed by the reflected radiation 305r is a converging cone shaped pattern with a cylindrical gap of radius $R_f$. The reflected radiation 305r focuses at a focal distance 306a from the quasi-parabolic dish reflector 311 to form a focal ring 307 having a radius $R_f$. Between the focal distance 306a and an initial crossover distance 306b, the reflected radiation 305r from the focal ring 307 diverges such that the resulting radiation pattern is a cylinder roughly of radius $R_f$ with a cone shaped gap having a radius of $R_f$ at the focal distance 306a and converging to a point at the initial crossover distance 306b. At the initial crossover distance 306b from the quasi-parabolic dish reflector 311, reflected radiation 305r reflected from the outer portions of quasi-parabolic dish reflector 311 just begin to overlap in the center at the axis of symmetry 302. At distances between the initial crossover distance 306b and a complete crossover distance 306c from the quasi-parabolic dish reflector 311, the resulting radiation pattern is made up of a cylinder roughly of radius $R_f$ having reflected radiation 305r with no overlap and a cone of overlapping reflected radiation 305r growing from a point at the initial crossover distance 306b to a radius of $R_f$ at the complete crossover distance 306c. At the complete crossover distance 306c, the reflected radiation 305r reflected from the left partial parabola and the right partial parabola of any cross section of the quasi-parabolic dish reflector 311 completely overlap with one another. As distances increase beyond the complete crossover distance 306c, the reflected radiation 305r reflected from the quasi-parabolic dish reflector 311 diverges such that it progressively overlaps proportionally less with itself. The resulting radiation pattern in this region is a conical section of non overlapping radiation having an initial radius of about $R_f$ at the complete crossover distance 306c to an infinite radius at infinity, with a core of overlapping radiation generally in the shape of a cylinder of radius $R_f$, which makes-up proportionally 100% of the radiation pattern at the complete crossover distance and proportionally 0% of the radiation pattern at infinity.

For completeness, a circular PV unit 326 of the quasi-parabolic concentrator 300 having a radius $R_f$ and located at the initial crossover distance 306b is shown in FIG. 3.

Figure 4:
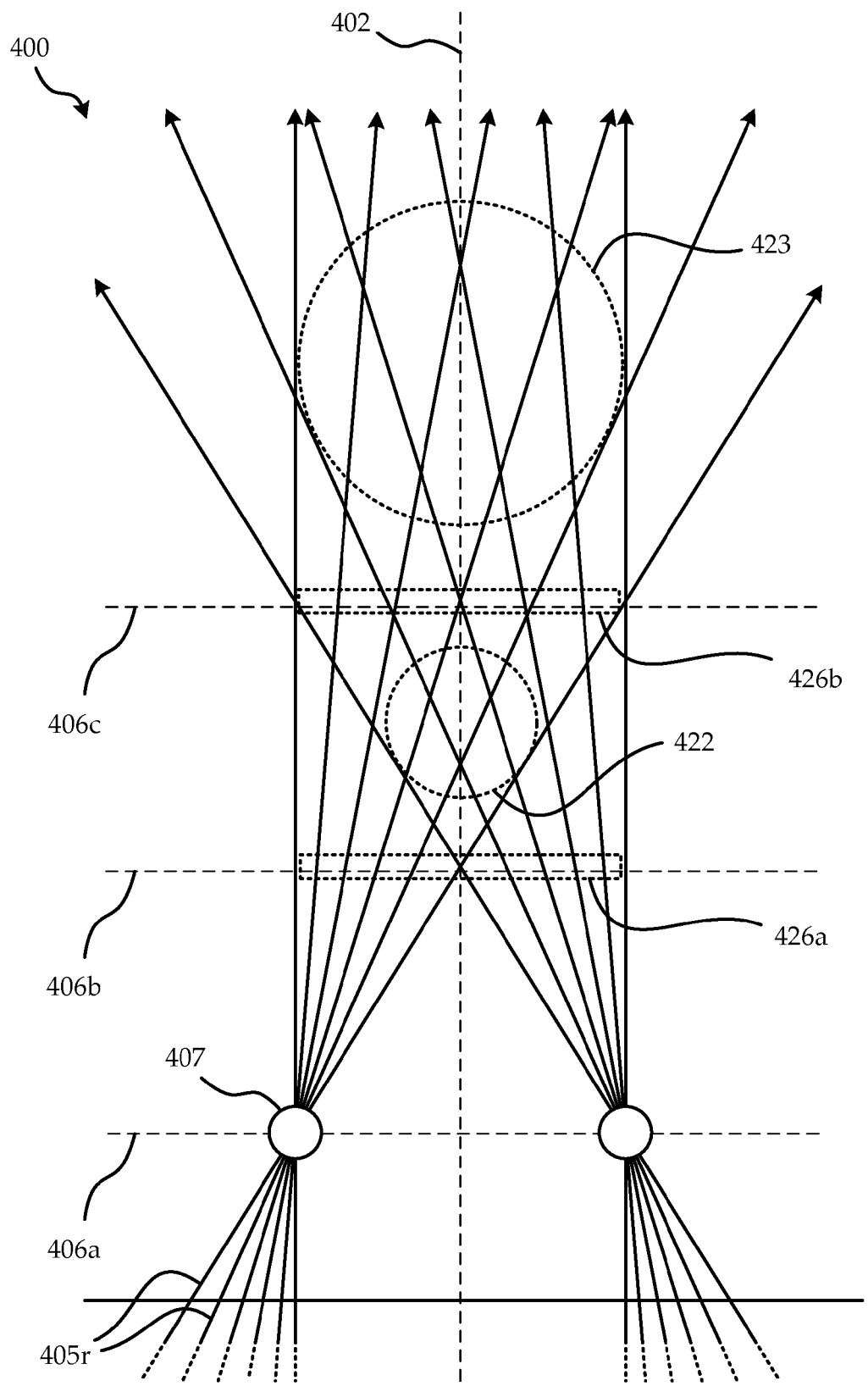
FIG. 4 is a diagram of the reflected radiation from a quasi-parabolic reflector according to an embodiment of the invention.

Referring to FIG. 4, a configuration of the target devices in a radiation pattern produced by the quasi-parabolic dish reflector 311 of FIG. 3 will now be discussed. A single two dimensional cross-section taken through the axis of rotational symmetry is shown. Reflected radiation 405r converges at a focal ring 407 at a focal distance 406a from the quasi-parabolic dish reflector. A PV unit having a radius roughly the same as $R_f$ is generally placed between an initial crossover distance 406b from the quasi-parabolic dish reflector as illustrated by PV unit 426a, and a complete crossover distance 406c from the quasi-parabolic dish reflector as illustrated by PV unit 426b. Due to the finite angular size of the sun in the sky, and with use of further lenses or diffusers, the PV unit 426a may be placed at a distance just closer to or just farther from the quasi-parabolic dish reflector than the initial crossover distance 406b. This is made possible due to a smoothing out of the gap or the overlap that otherwise would be sharply defined near the center at the axis of symmetry.

As can be seen in FIG. 4, substantially all of the reflected radiation 405r is spread over the entire area of the PV unit 426a, at the initial crossover distance 406b such that there is singular coverage, and at the complete crossover distance 406c substantially all of the reflected radiation 405r is spread over the entire area of the PV unit 426b such that there is double coverage. The consequences of the radiation pattern having singular coverage and double coverage will be discussed in more detail hereinbelow.

To convert solar energy into thermal energy a reservoir or conduit such as pipe 422 or large pipe 423 is used. As with the PV units, a pipe sufficiently large may be located at distances around and between the initial crossover distance 406b and the complete crossover distance 406c, although if the pipe has a radius smaller than $R_f$ as is the case for pipe 422, it may be placed at a distance such that the overlapping cone of double coverage is incident upon the pipe 422 to ensure a large proportion of the entire reflected radiation is incident upon the surface of the pipe 422. A large pipe 423 may also be placed at a distance within the cylinder of double coverage beyond the complete crossover distance 406c, and may be mounted permanently in association with a non-permanently mounted PV unit 426a, 426b. In such embodiments, the quasi-parabolic concentrator has dual modes of operation, thermal and photo-voltaic.

Figures 5, 6:
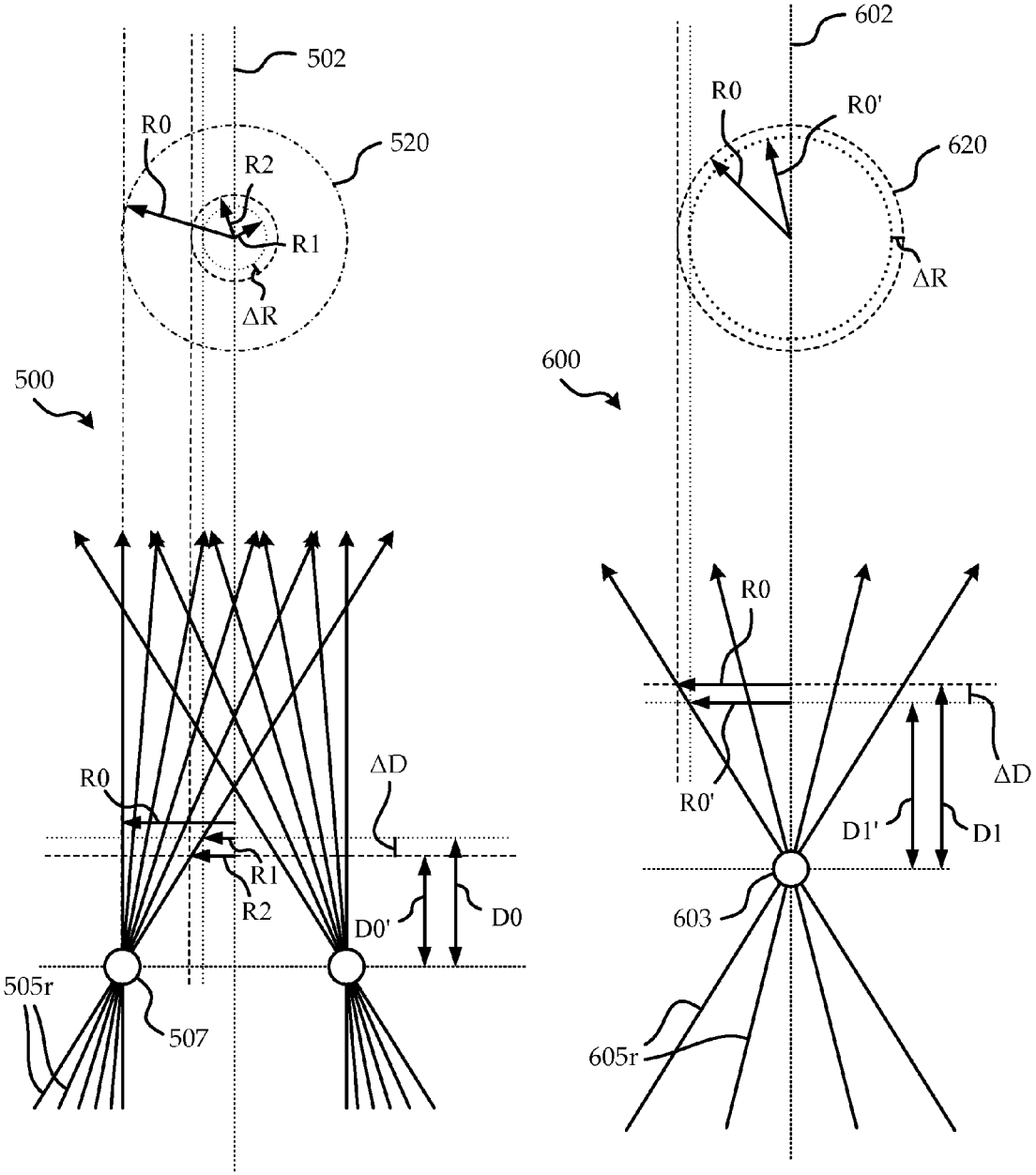
FIG. 5 is a diagram of the reflected radiation from a quasi-parabolic reflector according to an embodiment of the invention illustrating sensitivity to changes in distance.
FIG. 6 is a diagram of the reflected radiation from a parabolic reflector illustrating sensitivity to changes in distance.

Referring now to FIG. 5 and FIG. 6, the effects of a variation in distance of a PV unit from the quasi-parabolic reflector of a quasi-parabolic concentrator and the effects of a variation of a distance of a PV unit from a known parabolic concentrator will now be compared.

FIG. 5 depicts the radiation pattern 500 of a quasi-parabolic dish reflector such as that illustrated in FIG. 3. Reflected radiation 505r converges into a focal ring 507 at a focal distance from the quasi-parabolic dish reflector which has a vertical axis of symmetry 502. A PV unit 520 of radius R0 is located between the initial crossover distance and the focal distance, at a distance D0 such that the radius to the outer edge of the reflected radiation 505r is also R0. The total amount of reflected radiation 505r is incident upon the PV unit 520 and has an area of $\pi R0^2 - \pi R1^2 = \pi(R0^2 - R1^2)$. If the PV unit 520 were to shift by $\Delta D$ to a distance D0', the total amount of reflected radiation 505r would be incident upon the PV unit 520 and would have an area of $\pi R0^2 - R2^2 = \pi(R0^2 - R2^2)$. Designating the absolute value of the slope of the reflected radiation 505r from the outside of the quasi-parabolic dish reflector as m, the magnitude of the change in radius $\Delta R$ is $\Delta D/m$, hence $R2 = R1 + \Delta D/m$. The change in area due to the shift is $\Delta A = -\pi(2R1\Delta D/m + (\Delta D/m)^2)$. The reduction in area in shifting from D0 to D0' is reflected in an increase in intensity. The closer the set position of the PV unit 520 is to the location of interest at which it would have complete singular coverage, namely the initial crossover distance, the closer R1 is to 0, and small shifts in distance result in a change in area having one term proportional to the square of the change in distance $(\pi \Delta D^2/m^2)$ and another term proportional to R1 $(\pi 2R1\Delta D/m)$ which vanishes at the initial crossover distance.

FIG. 6 depicts the radiation pattern 600 of a parabolic dish reflector. For comparison to the radiation pattern 500 of FIG. 5 it should be kept in mind that the slope of the reflected radiation 505r from the outside portions of the quasi-parabolic dish reflector is substantially the same as the slope of the reflected radiation 605r from the outside portions of the parabolic dish reflector (not shown) generating the radiation pattern 600 in FIG. 6.

Reflected radiation 605r converges into a focal point 603 at a focal distance from the parabolic dish reflector which has a vertical axis of symmetry 602. A PV unit 620 of radius R0 is located at a distance D1 such that the radius if the outer edge of the reflected radiation 605r is also R0. The total amount of reflected radiation 605r is incident upon the PV unit 620, and has an area of $\pi R0^2$. If the PV unit 620 were to shift by $\Delta D$ to a distance D1', the total amount of reflected radiation 605r would be incident upon the PV unit 620 and would have an area of $\pi R0'^2$. The absolute value of the slope of the reflected radiation 605r from the outside of the parabolic dish reflector is m, the same as that of the quasi-parabolic dish reflector of FIG. 5, and hence the magnitude of the change in radius $\Delta R$ is $\Delta D/m$, and therefore $R0 = R0' + \Delta D/m$. The change in area due to the shift is $\Delta A = -\pi(2R0'\Delta D/m + (\Delta D/m)^2)$. The reduction in area in shifting from D1 to D1' is reflected in an increase in intensity. At the set position of interest for the PV unit 620, at which it would have complete singular coverage, namely at distance D1 from the focus 603, small shifts in distance result in a change in area having one term proportional to the square of the change in distance $(\pi \Delta D^2/m^2)$ and another term proportional to R0' $(\pi 2R0'\Delta D/m)$ which approaches the non-zero value R0 for smaller and smaller shifts in position.

As such a change in area and hence intensity due to a shift in the position of a PV unit for a quasi-parabolic dish reflector is smaller than a change in area and intensity due to a shift in the position of a PV unit for the parabolic dish reflector. The performance, stability, and behavior of the quasi-parabolic concentrator thus is less susceptible to changes in the distance of the PV unit from the reflector.

Figure 7:
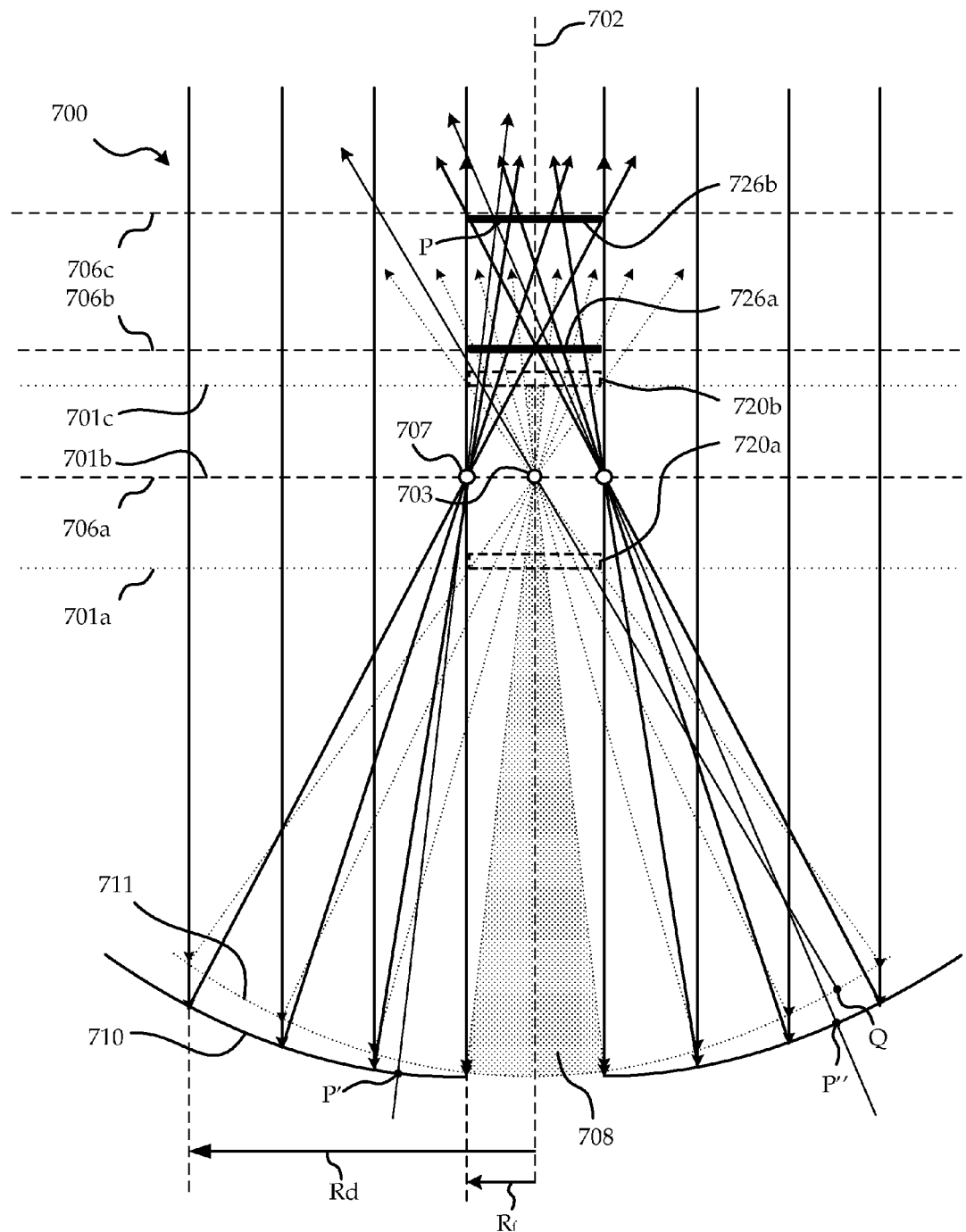
FIG. 7 is a diagram further comparing the reflected radiation from a parabolic reflector and a quasi-parabolic reflector according to an embodiment of the invention.

Referring now to FIG. 7, radiation patterns 700 of reflected radiation from a quasi-parabolic dish reflector 710 and a parabolic dish reflector 711 are shown superimposed for direct comparison. As discussed above, the quasi-parabolic dish reflector 710 comprises, in any cross section a left partial parabola and a right partial parabola, each of which is shifted a distance $R_f$ and each similar in shape to a respective half of a known parabola. The quasi-parabolic dish reflector therefore has a gap (which may or may not be reflective or even spanned by the dish structure) having a radius of $R_f$.

The known parabolic dish reflector 711 has a focus 703 a focal distance 706a away from the parabolic dish reflector 711. A PV unit 720a or 720b is ideally positioned at a distance less than or greater than the focal distance 701b such that the outer radius of the radiation pattern is the same size as the radius of the PV unit 720a or 720b. At either distance 701a, 701c, the PV unit 720a, 720b encounters its own shadow 708 which forms a circle centered on the axis of symmetry 702 which is absent reflected radiation. Such a local minimum of radiation intensity would greatly harm the efficiency of the PV unit 720a, 720b and hence diffusers and/or lenses are often used in an attempt to scatter the radiation, otherwise incident outside of the shadow and evenly over a relatively large area, so as to redirect it into the central area of the shadow. As described hereinabove techniques utilizing diffusers and/or lenses have their limits and some energy of radiation will be lost due to reflection, refraction, or absorption at the diffusers and/or lenses. For clarity, incident radiation from the source, only out to a radius of Rd is depicted in FIG. 7.

The quasi-parabolic dish reflector 710 has a focal ring 707 a focal distance 701b away from the quasi-parabolic dish reflector 710. A PV unit 726a or 726b is ideally positioned at the complete crossover distance 706c or at the initial crossover distance 706b or anywhere between, such that the outer radius of the radiation pattern is substantially the same size as the radius of the PV unit 726a or 726b. Since the PV unit 726a, 726b has a radius substantially the same as the focal ring 707, and the radius of the gap, no shadow is cast by the PV unit 726a, 726b onto reflecting portions of the quasi-parabolic dish reflector, and hence at distances between the initial crossover distance 706b and the complete crossover distance 706c, no shadow or extreme local minima in intensity exists. Beyond the initial crossover distance 706b, there is an increasingly growing central area of double coverage as discussed above, which does not serve to limit the efficiently of the PV unit 726a, 726b. However, if the central hotspot encountered just beyond the initial crossover distance 706b would otherwise cause damage to the PV unit 726a, a small diffuser and/or lens may be used to spread or redirect the hotspot outward. Since the hotspot is relatively small, the likewise small diffuser and/or lens would have a minimal footprint. Generally, utilizing diffusers and/or lenses to spread out a small hotspot is less disruptive than attempting to evenly gather radiation from a larger area to fill in a hole in the radiation pattern (i.e. a shadow).

It is clear that no matter what distance the PV unit 720a, 720b is located at, reflected radiation from any one point Q of the parabolic dish reflector 711 is incident upon the PV unit 720a, 720b at one spot on the active surface of the PV unit 720a, 720b, and that spot on the active surface of the PV unit 720a, 720b has radiation incident upon it from only that one point Q of the parabolic dish reflector 711.

In a case that the PV unit 726b is located at the complete crossover distance 706c, it is clear that every spot on the active surface of the PV unit 726b has radiation incident upon it from two points of the quasi-parabolic dish reflector 710, radiation from one point of the left partial parabola and radiation from one point of the right partial parabola. For example, spot P on the PV unit 726b surface is illuminated by point P' of the left partial parabola of the quasi-parabolic dish reflector 710, as well as being illuminated by point P''' of the right partial parabola of the quasi-parabolic dish reflector 710. It is due to the illumination by two distinct points of the quasi-parabolic dish reflector 710 that the PV unit 726b is referred to as subject to double coverage at the complete crossover distance 706c.

A consequence of the partial double coverage on the PV unit 726b between the initial crossover distance 706b and the complete crossover distance 706c, and the complete double coverage at the complete crossover distance 706c, is that a quasi-parabolic concentrator is much more robust in the face of surface defects such as post-installation localized damage, blemishes, dirt or interfering matter such as bird feces than a known parabolic concentrator subject to the same surface defect. For the same reason, the quasi-parabolic concentrator is more robust than the known parabolic concentrator in the face of pre-installation damage and or any other surface defect which could arise during manufacture, assembly, or during shipment.

Figure 8:
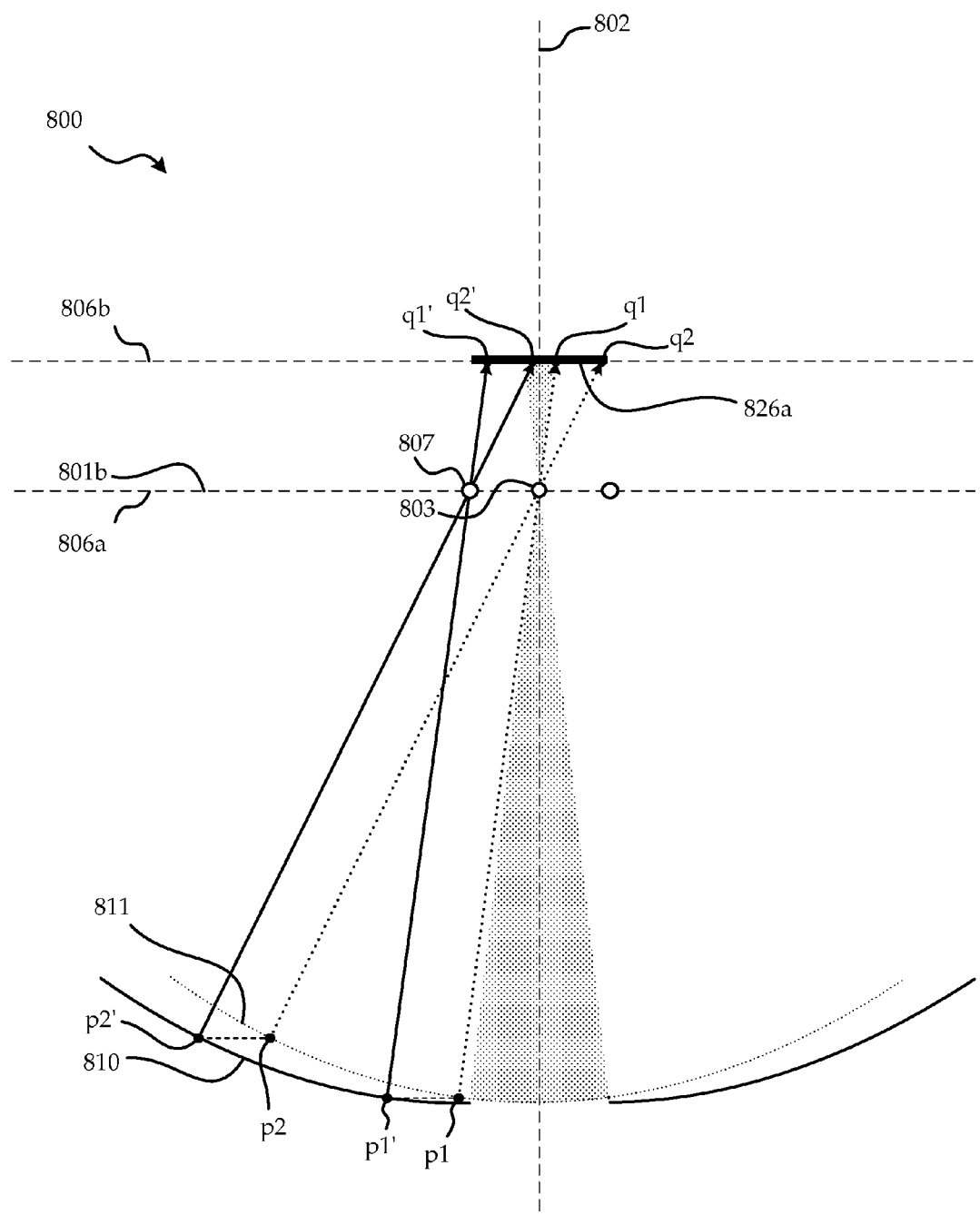
FIG. 8 is a diagram further comparing the reflected radiation from a parabolic reflector and a quasi-parabolic reflector according to an embodiment of the invention.

Referring now to FIG. 8, a qualitative illustration of relative intensity across a PV unit 826a is discussed. It is known that a known parabolic concentrator reflecting incident radiation from a distant object illuminates a flat PV unit with a circularly symmetric pattern having an intensity maximum near the center (outside of any shadow) and monotonically decreasing to a minimum at the edges. As such, in FIG. 8, the reflected radiation from point p1 on the parabola 811 passing through the focus 803 and falling on the PV unit 826a at spot q1, has a higher intensity than that from point p2 on the parabola 811 passing through the focus 803 and falling on the PV unit 826a at spot q2.

An equivalent point to p1, on the left partial portion of the quasi-parabola 810, p1', is shifted a distance $R_f$ away from p1 and away from the axis of symmetry 802. The point p1' reflects radiation from the quasi-parabola 810 at the same angle as that reflected from p1 of the parabola 811, to pass through the focal ring 807 and fall on the PV unit 826a at a spot q1' at the same angle that the incident radiation falls on q1 after being reflected by the parabola 811. An equivalent point to p2, on the left partial portion of the quasi-parabola 811, p2', is shifted a distance $R_f$ away from p2 and away from the axis of symmetry 802. The point p2' reflects radiation from the quasi-parabola 810 at the same angle as that reflected from p2 of the parabola 811, to pass through the focal ring 807 and fall on the PV unit 826a at a spot q2' at the same angle that the incident radiation falls on q2 after being reflected by the parabola 811.

It is to be noted that the pattern reflected by the parabola 811 is such that radiation from the relatively central areas of the reflector, such as from point p1, is reflected to the relatively central area of the PV unit 826a, such as at spot q1, and radiation from the relatively outer areas of the reflector, such as from point p2, is reflected to the relatively outer areas of the PV unit 826a, such as at spot q2. In contrast to the pattern reflected by the parabola 811, the pattern reflected by the quasi-parabola 810 is such that radiation from the relatively central areas of the reflector, such as from point p1', is reflected to the relatively outer areas of the PV unit 826a, such as at spot q1', and radiation from the relatively outer areas of the reflector, such as from point p2', is reflected to the relatively central area of the PV unit 826a, such as at spot q2'.

This reversal of inner and outer intensity plays a role in the generally homogeneous intensity resulting from solar radiation reflecting from the quasi-parabolic concentrator of the invention.

Figure 9A:
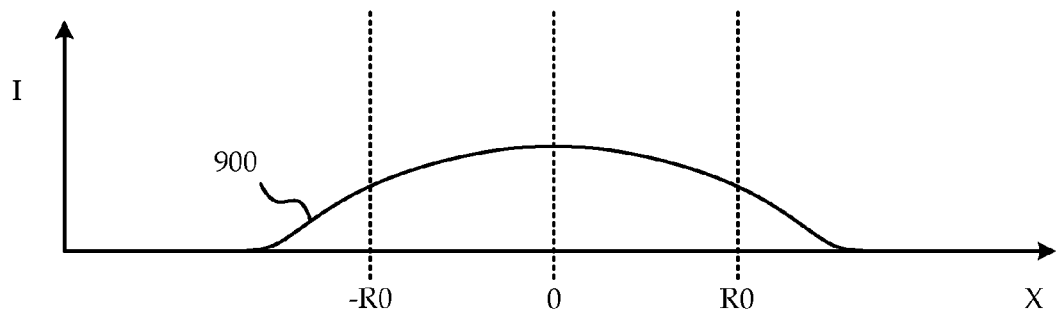
FIG. 9A is a graph depicting a magnitude of intensity across a PV unit of a known parabolic concentrator.
Figure 9B:
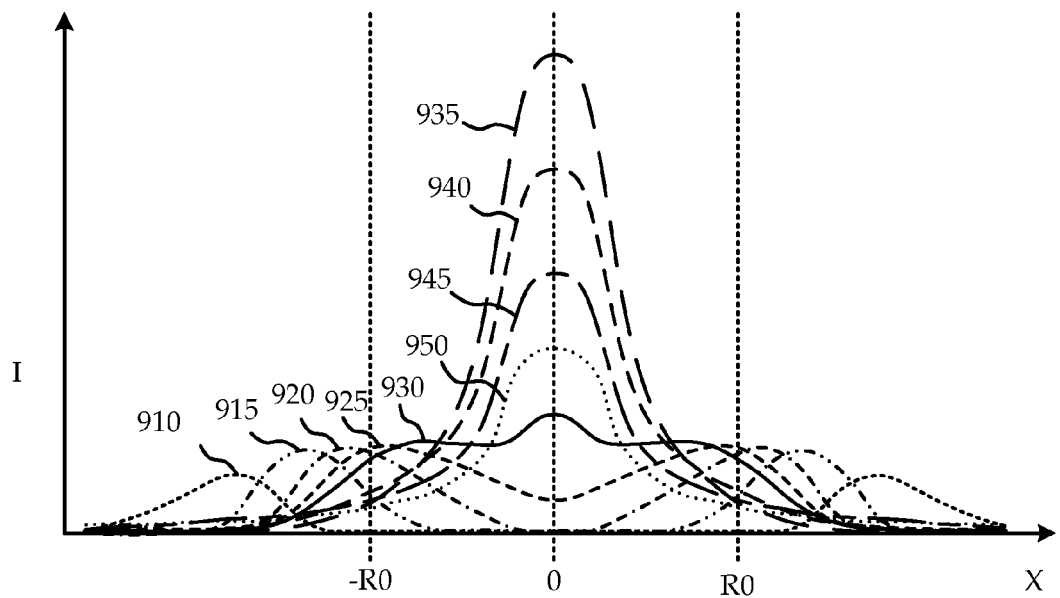
FIG. 9B is a graph depicting a magnitude of intensities across a PV unit of a quasi-parabolic concentrator at various distances.

With reference to FIG. 9A and FIG. 9B intensities of the radiation patterns of a known parabolic reflector and a quasi-parabolic reflector are discussed. Each graph shows a plot of intensity I against position X across a PV unit.

FIG. 9A shows an intensity plot of a radiation pattern from a known parabola falling incident on a PV unit as discussed above. As can be seen, intensity is largest in the center of the PV unit (position X=0) and falls off to zero intensity on either side of the axis of symmetry. For clarity, FIG. 9A does not show the shadow or the correction applied to it by a diffuser or lens.

FIG. 9B shows a number of intensity plots of a radiation pattern from a quasi-parabolic reflector according to the invention falling incident on a PV unit as discussed above. Each plot shows the intensities resulting for a specific distance between the PV unit and the quasi-parabolic reflector. Intensity plot 930 shows intensities when the distance is just beyond the initial crossover distance. Each of intensity plots 910, 915, 920, 925, 935, 940, 945, 950 correspond to the intensities across a PV unit at respectively distances offset from the initial crossover distance of: −50 mm; −25 mm; −12.5 mm; −5 mm; +25 mm; +50 mm; +75 mm; +100 mm.

Clearly intensities near the initial crossover distance, indicated by 930, are generally homogenous over a large area of the PV unit. Also of note is the intense concentration at the central areas at distances beyond the initial crossover distance, allowing for thermal applications to sit behind the PV applications, and since the intensities at the central area are relatively concentrated for a large range (up to 75 mm), tolerances of thermal applications are improved and hence so are efficiencies.

Figure 10:
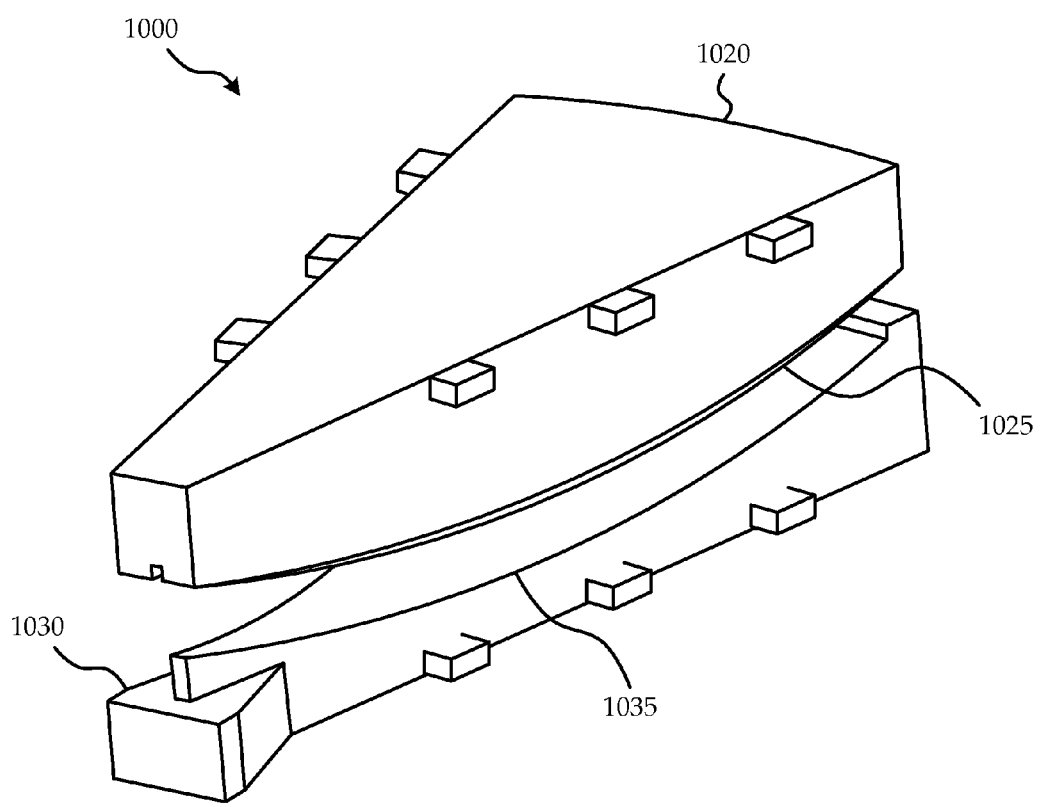
FIG. 10 is a diagram of a stamping apparatus for use in forming a petal of a quasi-parabolic dish reflector according to an embodiment of the invention.
Figure 11:
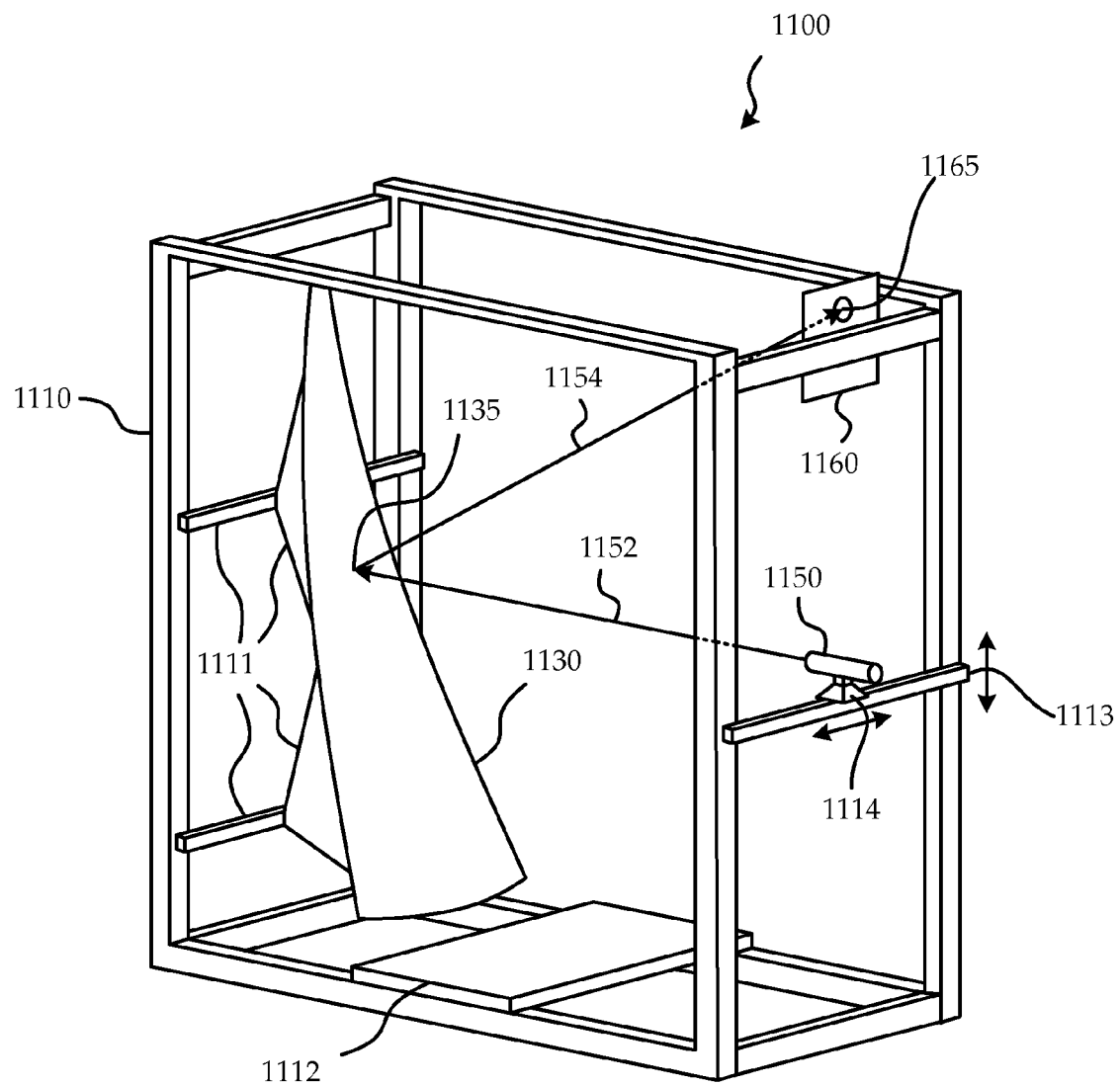
FIG. 11 is a diagram of a testing apparatus for use in testing a petal of a quasi-parabolic dish reflector according to an embodiment of the invention.
Figure 12:
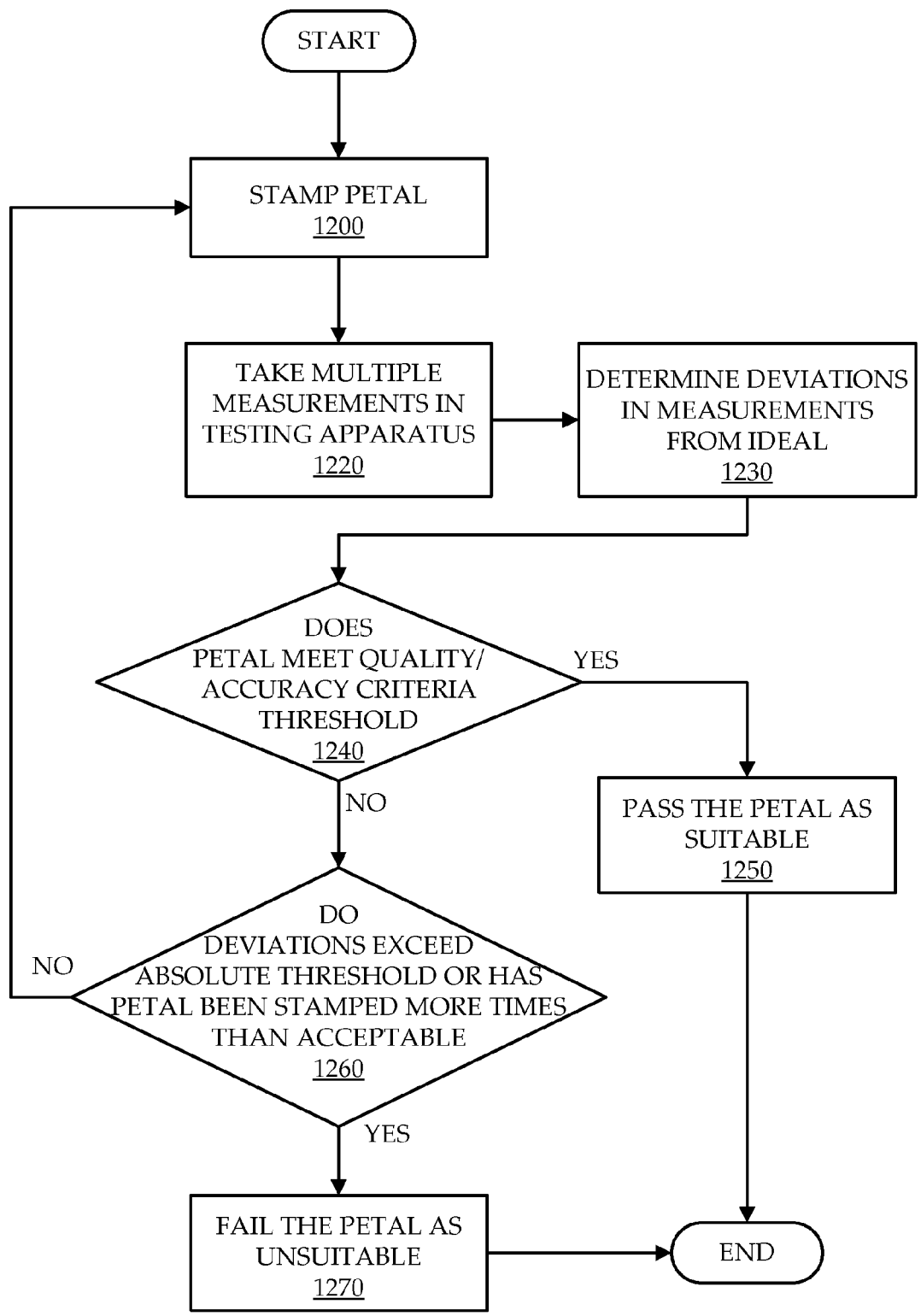
FIG. 12 is a functional block diagram of a process for forming and testing a petal of a quasi-parabolic dish reflector according to an embodiment of the invention.

With reference to FIGS. 10, 11, and 12 a system and method of manufacturing and testing a petal of the quasi-parabolic reflector will now be discussed.

Although many different methods may be utilized to construct a petal of the quasi-parabolic reflector discussed above, a person skilled in the art will understand different methods will be appropriate for different materials from which the petal is made. In the manufacturing embodiment depicted in FIG. 10, each petal is constructed from a lightweight metal such as aluminum with a hard reflective coating deposited thereon. In some embodiments the reflective material is anodized and laminated to the aluminum base material and may be nonmetallic such as a hard plastic-based material.

Rather than being die cast or machined, the aluminum base material, in the form of a plate or sheet, is cut to roughly the same shape as, although a little larger than, the finished petal but having no appreciable curvature. This petal is treated so that the reflective coating is deposited thereon, and then the composite material petal is stamped.

FIG. 10 depicts a stamping apparatus 1000 for stamping the composite material petal into a shape for use in a reflector of a solar concentrator. The stamping apparatus 1000 includes an upper stamping portion 1020 and a lower stamping portion 1030, the upper stamping portion 1020 having an upper stamping surface 1025 and the lower stamping portion 1030 having a lower stamping surface 1035. The shape of the upper stamping surface 1025 and the lower stamping surface 1035 are substantially the same as each other, which is a modified version of the desired petal shape. Specifically, in the embodiment depicted in FIG. 10, the upper and lower stamping surfaces 1025, 1035 have curvatures whose magnitudes are greater than the magnitudes of the curvature of the final petal, for example, the magnitude of the convex curvature of the upper stamping surface 1025 is greater than a magnitude of the concave curvature of a desired petal, and the magnitude of the concave curvature of the lower stamping surface 1035 is greater than a magnitude of the convex curvature of a desired petal. By stamping with magnitudes of curvatures which are greater than what is desired in the produced stamped petal, this stamping process takes into account the rigid nature of the composite material petal which will exhibit a certain amount of spring back once stamped. In order to prevent the hard reflector material from peeling-off or cracking, the level of overcompensation of the curvature (the amount by which the stamp curvature is greater than a curvature of a desired petal) of the upper and lower stamping portions does not exceed the limit ratio of the curvature of the petal at which the reflector material would be damaged. Although this may require a greater number of multiple stampings, the quality and durability of the final product is greatly enhanced.

Referring now also to FIG. 11, a testing apparatus 1100 for testing and refining a petal 1130 will now be described.

After each stamping cycle through the stamping apparatus 1000 depicted in FIG. 10, the stamped composite material petal is subjected to testing in the testing apparatus 1100. The testing apparatus 1100 includes a frame 1110 for supporting and holding in place the stamped composite material petal 1130, a laser light source 1150, and a target 1160. To facilitate loading of the petal 1130, which is of considerable weight, a platform 1112 is provided in front of the support structure 1111 on which the composite material petal 1130 is mounted for testing.

The laser light source 1150 is mounted such that it provides a beam of light 1152 in a direction which, relative to the composite material petal 1130, is parallel to the direction light rays would travel from the sun when the quasi-parabolic concentrator in which the petal 1130 is installed is aligned with the sun. The laser light source 1150 is mounted on a first translating mount 1114 for translating the laser light source 1150 in a first direction within a plane substantially perpendicular to the beam of light 1152, and is also mounted on a second translating mount 1113 for translating the laser light source 1150 in a second direction within a plane substantially perpendicular to the beam of light 1152 and also substantially perpendicular to the first direction. This enables laser light source 1150 to target various points on the stamped composite material petal 1130 for testing, such as point 1135.

The beam of light 1152 from the laser light source 1150 reflects from the composite material petal 1130 as reflected beam 1154 which strikes the target 1160 at a point of incidence 1165. In some embodiments the target 1160 is placed at a distance substantially equal to the distance which would exist between the focal area and the petal of a parabolic reflector. In the embodiment depicted in FIG. 11, the laser light source 1150 is positioned at various predetermined locations at different first direction and second direction coordinates. In one embodiment of the invention the laser light source 1150 is located at 16 different predetermined locations during testing of a petal. The target area 1160 is either marked, or monitored by light scanning apparatus (not shown for clarity) in order to compare the actual point of incidence 1165 with the calculated point of incidence for an ideal petal. Depending upon the level of accuracy or inaccuracy of each of the points of actual incidence, the composite material petal 1130 may be sent back for additional stamping, may be discarded, or may be determined to be within quality and accuracy tolerances meeting the standard of a final finished composite material petal. In some embodiments each point of incidence upon the target area is also inspected for quality by inspecting the spread and/or shape of the incident light on the target. In some embodiments an average of the deviations is determinative of an overall accuracy which is measured against an overall accuracy threshold. In other embodiments a deviation exceeding a maximum threshold is determinative of a failed petal which should be discarded, and in other embodiments a weighted average of deviations is compared to a maximum weighted average deviation threshold.

Referring now to FIG. 12, a method of iteratively stamping and testing of a composite material petal will now be described.

At 1200 a composite material petal is first stamped in accordance with an assumed number of stampings required to bring an average composite material petal to its proper shape. At 1220 the petal is mounted on the testing apparatus and multiple measurements are taken with the laser light source at multiple locations. The resulting incident locations on the target as well as the quality of the incident radiation are recorded and a determination is made as to how much these deviate from the ideal petal in 1230. The next step is to determine if the petal meets the quality/accuracy threshold at 1240. The quality of the incident beam is determined with use of the spread and/or shape of the incident light on the target, while in general accuracy may be determined by determining the difference between the location of the center of an incident beam on the target area and the location where the beam would have been incident upon the target had it been reflected by a reference petal having an ideal or target curvature. If the petal meets the quality and accuracy criteria thresholds it is passed as a finished petal for use in a parabolic concentrator in step 1250 and then the process ends. If the petal does not meet the quality and accuracy criteria, at step 1260 it is determined whether the petal either has deviations which exceed an absolute threshold level or has been stamped more times than is acceptable. If either of these conditions exist, the petal is determined in step 1270 to be a failure and unsuitable for use in a quasi-parabolic concentrator. If neither of these conditions exist, the petal is determined to be worth attempting to rectify through further processing and the process returns to a further step of stamping 1200.

The process of FIG. 12 allows for multiple stamping of petals based on a measurement of the actual quality and accuracy of the petal. This allows early identification of petals which are unsuitable, and also early identification of petals which are suitable after relatively few stamping cycles. This reduces stresses on the reflective material and the risk of cracking or peeling due to stamping, by eliminating unnecessary stamping cycles.

Although embodiments of the quasi-parabolic concentrator discussed above have been described in the context of a circularly or rotationally symmetric dish reflector, elliptical variations of the quasi-parabolic concentrator and linear extruded variations of the quasi-parabolic concentrator are also contemplated by the invention. In such embodiments, instead of a focal ring, a focal ellipse or two parallel focal lines result. Although embodiments of the quasi-parabolic concentrator discussed above have been described as comprising two separated partial parabolas on either side of an axis or plane of symmetry, other shapes may be utilized to give rise to the equivalent radiation patterns to those disclosed above such as parabolas which are separated and rotated toward or away from the axis or plane of symmetry, or parabolas which are not separated but are rotated, compound parabolas, or other forms substantially forming and having two focal areas on either side of the axis of symmetry.

In these embodiments, cross sections of the reflector possess two separate foci, such that there is overlap or double coverage within the radiation pattern. As long as there exist areas within the radiation pattern in which there is double coverage, the concentrator provides robust performance in the face of surface defects whether due to post-installation or pre-installation activities and/or incidents.

Although embodiments of the quasi-parabolic concentrator discussed above have been described as comprising two distinct foci, other embodiments may utilize partial parabolas or other shapes to give rise to areas of radiation which are nearly focal referred to as focal areas. In such embodiments there would exist crossover of radiation but the areas of crossover would not necessarily be restricted to a point, ring or line, but instead could be a surface, such as a cylinder, or a volume, such as a torus. As long as the nearly focal regions are such that the radiation pattern has areas of double coverage, the concentrator will still remain robust in the face of surface defects. Also, as long as the quasi-parabolic reflector generates a radiation pattern in which radiation from the central areas of the reflecting surface are reflected to the outer areas of a PV unit and radiation from the outer areas of the reflecting surface are reflected to the central areas of the PV unit, improvements to the homogeneity of the radiation on the PV unit may be obtained.

Although, the embodiments described above include a straight trough of constant width and a circular or elliptical dish, the invention applies also to non-straight troughs and/or troughs having varying widths, as well as non-rotationally symmetric dishes which nonetheless are symmetric at each angle through a single axis. Other forms such as troughs which are contiguous and having no ends such as a trough which describes a circle or an ellipse in a horizontal plane are also contemplated. Skilled persons in the art will understand that various forms utilizing reflective cross-sections with two focal areas in accordance with the teachings hereinabove are in accordance with the invention.

The embodiments presented are exemplary only and persons skilled in the art would appreciate that variations to the embodiments described above may be made without departing from the scope of the invention. The scope of the invention is solely defined by the appended claims.

What is claimed is:

1. A quasi-parabolic reflector for a quasi-parabolic solar concentrator comprising:
    a concave reflective surface, the concave reflective surface comprising a cross-section substantially symmetric about an axis of symmetry, wherein the cross-section comprises:
        a first reflective portion on a first side of the axis of symmetry, the first reflective portion having a first focal area, the first focal area located on a concave side of the concave reflective surface and on the first side of the axis of symmetry and at a first distance away from the axis of symmetry; and
        a second reflective portion on a second side of the axis of symmetry, the second side of the axis of symmetry opposite the first side of the axis of symmetry, the second reflective portion having a second focal area, the second focal area located on the concave side of the concave reflective surface and on the second side of the axis of symmetry and at a second distance away from the axis of symmetry; and
    wherein the first focal area and the second focal area are substantially at a focal distance away from the concave side of the concave reflective surface, and wherein incident radiation which is incident upon the concave side of the concave reflective surface and propagating in a direction substantially parallel to the axis of symmetry is reflected from the concave reflective surface as reflected radiation such that reflected radiation reflected from the first reflective portion and reflected radiation reflected from the second reflective portion propagate to a radiation absorbing target,
    wherein each of the first reflective portion and the second reflective portion is concave in a generally same direction as a concavity of the concave reflective surface, and
    wherein the first reflective portion and the second reflective portion are such that beyond an initial cross-over distance, greater than the focal distance, from the concave side of the concave reflective surface, a first portion of the reflected radiation reflected from the first reflective portion overlaps a second portion of the reflected radiation reflected from the second reflective portion.

2. A quasi-parabolic reflector according to claim 1 wherein the first reflective portion and the second reflective portion are such that at a complete cross-over distance, greater than the focal distance, from the concave side of the concave reflective surface, a substantial entirety of the reflected radiation reflected from the first reflective portion substantially overlaps a substantial entirety of the reflected radiation reflected from the second reflective portion.

3. A quasi-parabolic reflector according to claim 1 wherein the first reflective portion and the second reflective portion are such that at a complete cross-over distance, greater than the focal distance, from the concave side of the concave reflective surface, a substantial entirety of the reflected radiation reflected from the first reflective portion substantially overlaps a substantial entirety of the reflected radiation reflected from the second reflective portion, and
    wherein the first reflective portion and the second reflective portion are such that beyond the complete cross-over distance from the concave side of the concave reflective surface, some of the reflected radiation reflected from the first reflective portion overlaps some of the reflected radiation reflected from the second reflective portion.

4. A quasi-parabolic reflector according to claim 1 wherein the first reflective portion of the cross-section forms a first partial parabola wherein the first focal area comprises a focus of the first partial parabola, and wherein the second reflective portion of the cross-section forms a second partial parabola wherein the second focal area comprises a focus of the second partial parabola.

5. A quasi-parabolic reflector according to claim 4 wherein the first reflective portion of the cross-section forms substantially a first half-parabola wherein the first focal area comprises a focus of the first half-parabola, and wherein the second reflective portion of the cross-section forms substantially a second half-parabola wherein the second focal area comprises a focus of the second half-parabola.

6. A quasi-parabolic reflector according to claim 1 wherein the quasi-parabolic reflector forms a trough.

7. A quasi-parabolic reflector according to claim 1 wherein the quasi-parabolic reflector forms a quasi-parabolic dish.

* * * * *